(12) United States Patent
Takemae

(10) Patent No.: US 8,766,711 B2
(45) Date of Patent: Jul. 1, 2014

(54) SWITCHING CIRCUIT WITH CONTROLLED DRIVER CIRCUIT

(75) Inventor: Yoshihiro Takemae, Yokohama (JP)

(73) Assignee: Transphorm Japan, Inc., Yokohama (JP)

(*) Notice: Subject to any disclaimer, the term of this patent is extended or adjusted under 35 U.S.C. 154(b) by 205 days.

(21) Appl. No.: 13/345,112

(22) Filed: Jan. 6, 2012

(65) Prior Publication Data

US 2012/0242375 A1    Sep. 27, 2012

(30) Foreign Application Priority Data

Mar. 24, 2011   (JP) ................................ 2011-066339

(51) Int. Cl.
*H03K 3/01*           (2006.01)

(52) U.S. Cl.
USPC ............ 327/546; 327/328; 327/332; 327/170

(58) Field of Classification Search
USPC .................................. 327/546, 328, 332, 170
See application file for complete search history.

(56) References Cited

U.S. PATENT DOCUMENTS

| | | | |
|---|---|---|---|
| 3,641,407 A * | 2/1972 | Scott ............................... | 361/84 |
| 4,322,770 A * | 3/1982 | Sendelweck ................. | 361/91.5 |
| 4,549,095 A * | 10/1985 | Stefani et al. ................. | 327/375 |
| 5,142,171 A | 8/1992 | Nunogawa et al. | |
| 5,537,073 A * | 7/1996 | Arimoto ....................... | 327/546 |
| 6,512,413 B2 * | 1/2003 | Okutsu et al. ................ | 327/543 |
| 2011/0291707 A1 | 12/2011 | Illegems | |

FOREIGN PATENT DOCUMENTS

| | | |
|---|---|---|
| JP | 1-255263 A | 10/1989 |
| JP | 2002-290224 A | 10/2002 |
| JP | 2006-025567 A | 1/2006 |
| JP | 2010-220330 A | 9/2010 |

* cited by examiner

*Primary Examiner* — Bao Q Vu

(74) *Attorney, Agent, or Firm* — Fish & Richardson P.C.

(57) ABSTRACT

A switching circuit device has a first transistor which has a drain coupled to a high-potential terminal, a source coupled to a low-potential power supply, and, a driving circuit, which outputs, to a gate of the first transistor in response to an input control signal, a pulse having a potential higher than a threshold voltage of the first transistor and a potential of the low-potential power supply, wherein the driving circuit has a first inverter including a second transistor provided between the gate and the source of the first transistor, wherein when the first transistor changes from on to off due to the pulse, the second transistor conducts and short-circuits the gate and the source of the first transistor.

14 Claims, 13 Drawing Sheets

FIG. 1
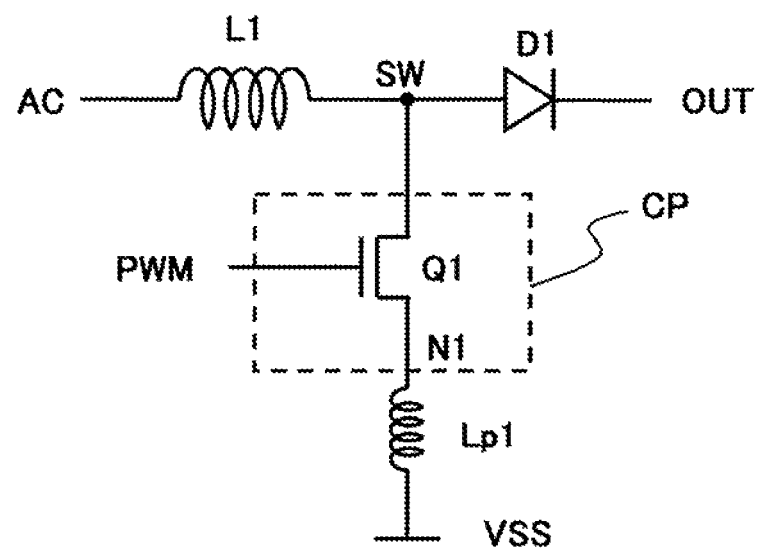
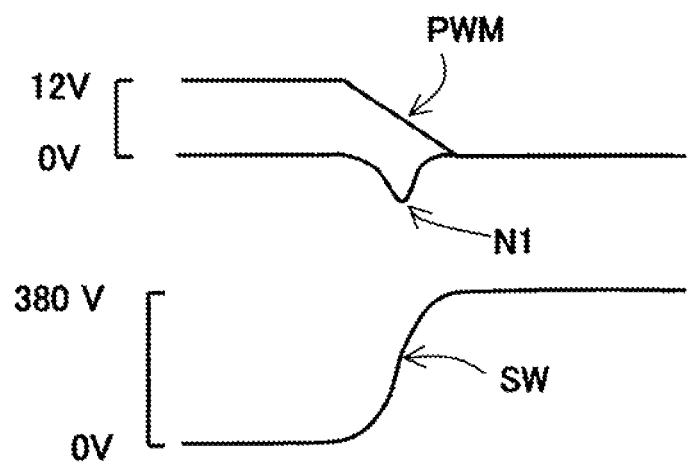

FIG. 2
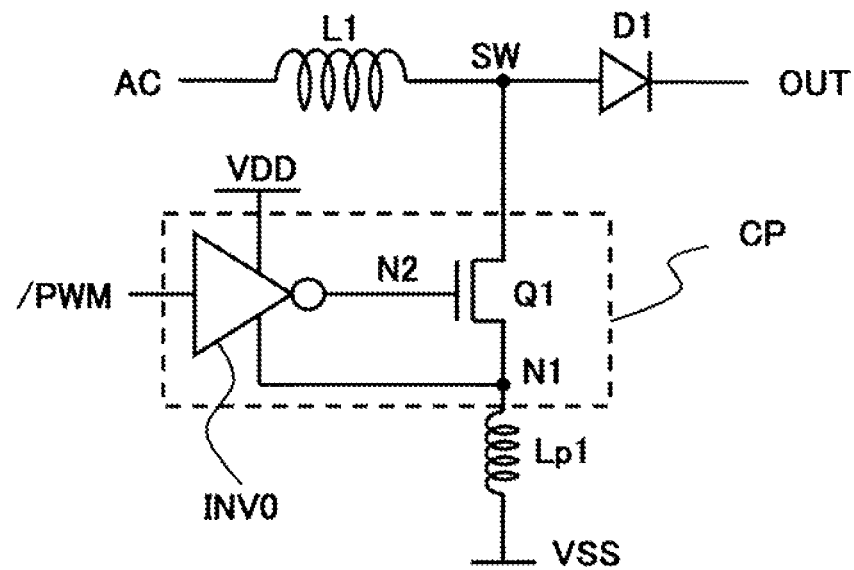
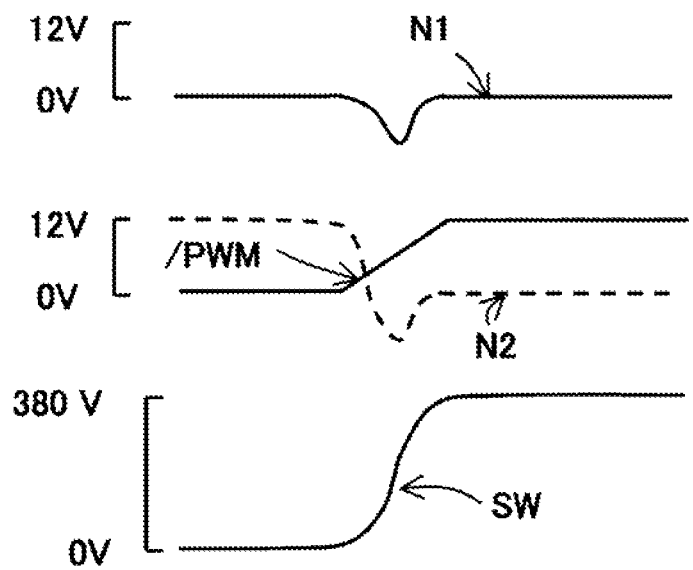

SWITCHING CIRCUIT WITH CONTROLLED DRIVER CIRCUIT

CROSS-REFERENCE TO RELATED APPLICATIONS

This application is based upon and claims the benefit of priority of the prior Japanese Patent Application No. 2011-66339, filed on Mar. 24, 2011, the entire contents of which are incorporated herein by reference.

FIELD

The present embodiment relates to a switching circuit device and a control circuit.

BACKGROUND

A power supply converter converts an input voltage into an output voltage having a prescribed voltage value, and outputs the output voltage to a load circuit. Such a power supply converter has, for example, a switching circuit with a high-withstanding-voltage switching transistor which turns the current flowing in a coil on and off, and a control circuit which controls the switching circuit such that the output voltage is at a desired potential. The input voltage is for example a commercial power supply, and the output voltage is for example an extremely high DC voltage such as 380 V. Hence the switching transistor within this switching circuit is a high-withstanding-voltage transistor which withstand high voltages.

The control circuit generates a control signal to drive the switching transistor such that the output voltage is the desired voltage. For example, when the output voltage is lower than the reference voltage, the switching transistor is made to conduct for a longer time, increasing the energy of the coil, whereas when the output voltage is higher than the reference voltage, the switching transistor is made to conduct for a shorter time, decreasing the energy of the coil. In this way, by controlling the on and off times of the switching transistor with high precision, the output voltage is precisely controlled at the desired voltage.

Such a power supply converter is for example described in Japanese Patent Application Laid-open No. H01-255263 and Japanese Patent Application Laid-open No. 2010-220330.

As explained above, the switching transistor in a switching circuit is required to withstand high voltages, and so use of compound semiconductor transistors of SiC, GaN and similar, rather than silicon semiconductor transistors, is proposed.

However, a high-voltage switching transistor switches large currents on and off each time switching occurs. Accompanying this, due to the parasitic inductance resulting from wiring on the semiconductor chip on which the switching transistor is formed, the bonding wire connecting between electrodes of package accommodating the semiconductor chip and electrode pads on the semiconductor chip, and similar, when a large current is switched from on to off a negative potential appears at the source terminal of the switching transistor, and there are cases in which an erroneous operation in which the switching transistor is inverted from off to on occurs. Such erroneous operation means that the turn-off operation of the switching transistor is not performed with high precision.

SUMMARY

A switching circuit device has: a switching circuit device has a first transistor which has a drain coupled to a high-potential terminal, a source coupled to a low-potential power supply, and, a driving circuit, which outputs, to a gate of the first transistor in response to an input control signal, a pulse having a potential higher than a threshold voltage of the first transistor and a potential of the low-potential power supply, wherein the driving circuit has a first inverter including a second transistor provided between the gate and the source of the first transistor, wherein when the first transistor changes from on to off due to the pulse, the second transistor conducts and short-circuits the gate and the source of the first transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1 depicts the power factor correction (PFC) circuit of an AC/DC converter and operation waveforms.

FIG. 2 depicts the PFC circuit and operation waveforms of the AC/DC converter of this embodiment.

DESCRIPTION OF EMBODIMENTS

Figure 3:
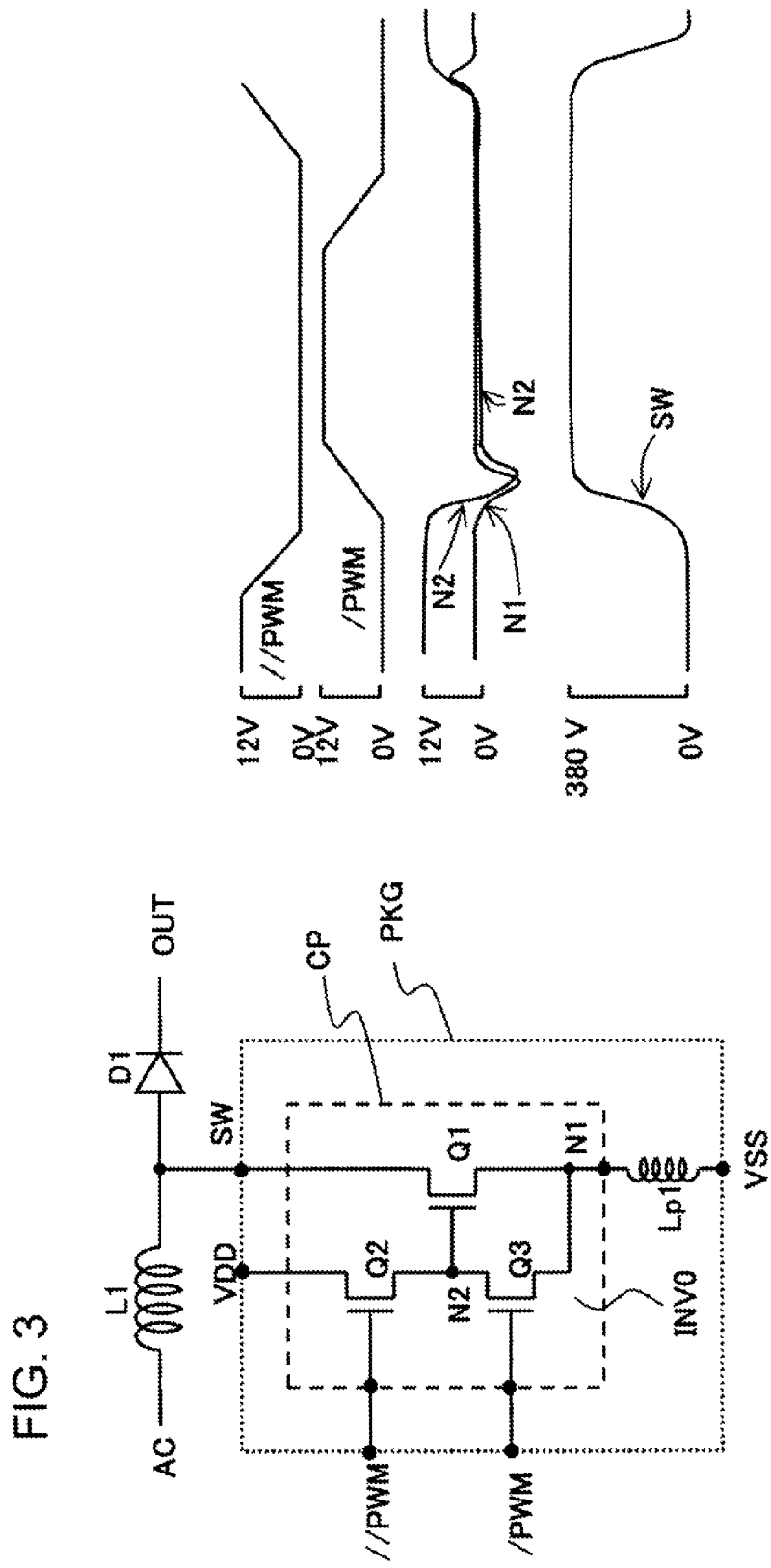
FIG. 3 depicts the PFC circuit and operation waveform of the AC/DC converter of a first embodiment.

FIG. 1 depicts the power factor correction (PFC) circuit of an AC/DC converter and operation waveforms. This power supply converter has a coil L1 to one end of which an AC voltage AC is applied, a diode D1 which is a unidirectional element coupled to the other end of the coil L1, and a high-withstanding-voltage power switching transistor Q1 provided between the node SW connecting the coil L1 and diode D1, and ground VSS which is a low-potential power supply. The switching transistor Q1 is for example an N-type enhancement type transistor, to the gate of which a control signal PWM is supplied as a driving pulse.

When the control signal PWM is at H level the switching transistor Q1 conducts, current flows from the node SW toward ground VSS which is the low-potential power supply, and energy accumulates in the coil L1. When the control signal PWM is at L level the switching transistor Q1 is non-conducting, and due to the current which occurs as a result of energy accumulated in the coil L1, the node SW goes to high potential (for example 380 V), the diode D1 conducts, and an output current flows at the output terminal OUT. A load circuit and a capacitor, not shown, are coupled to the output terminal OUT, and a DC output voltage occurs at the output terminal OUT due to the output current.

In this way, the switching transistor Q1 switches on and off the large current from the node SW toward ground VSS. When the switching transistor Q1 is turned on, the node SW is at high potential, and therefore the transistor Q1 has high withstand voltage characteristics. Further, the PFC circuit is a circuit having the coil L1, diode D1, and switching transistor Q1.

On the other hand, the switching transistor Q1 is formed on the semiconductor chip CP, and the source terminal N1 of the transistor Q1 formed on the semiconductor chip CP is coupled to the external ground VSS via for example a bonding wire. This bonding wire has a parasitic inductance Lp1. Hence as indicated by the operation waveforms of FIG. 1, when the control signal PWM switches from H level to L level, and the switching transistor Q1 is switched from on to off so that a large current is shut off, the parasitic inductance Lp1 continues to pass current, the charge of the source node N1 of the transistor Q1 is drawn away, and the source node N1 temporarily drops to a negative potential. As a result, a phenomenon occurs in which the gate-source voltage of the transistor Q1 exceeds a threshold voltage and the transistor Q1 again becomes conducting. That is, even when the transistor Q1 is controlled to turn off by the L level of the control signal PWM, the transistor Q1 is again turned on, and proper turn-off operation is not performed.

The control signal PWM is a driving pulse generated by a control circuit, not shown, and has for example a L level and H level of 0 V (the potential of the low-potential power supply VSS) and 12 V (the potential of the high-potential power supply VDD). The control circuit controls the pulse width of the H level of the control signal PWM so as to maintain the output voltage of the output terminal OUT at the desired potential. That is, by accurately controlling the on state and off state of the switching transistor Q1 according to the H level and L level of the control signal PWM, the output voltage of the output terminal OUT is controlled at the desired potential.

The switching transistor Q1 is required to have a high withstand voltage, and so a compound semiconductor transistor of for example GaN or SiC or similar is used. In particular, a GaN HEMT (high-electron mobility transistor) exhibits a high withstand voltage due to the large band gap of GaN, has high electron mobility and makes possible high electron densities, and so is suited to driving large currents.

However, the N-type enhancement HEMT has a low threshold voltage of for example 1~2 V. Hence when the source potential at N1 falls upon turning off the transistor as described above, the gate-source voltage may exceed the above low threshold voltage, so that an erroneous operation in which the transistor is again turned on readily occurs. If, as explained above, the transistor Q1 is not properly controlled to turn off upon switching a large current from on to off due to the parasitic inductance Lp1, it is difficult to accurately control the output voltage of the output terminal OUT of the AC/DC converter.

FIG. 2 depicts the PFC circuit and operation waveforms of the AC/DC converter of this embodiment. The switching circuit device CP of this PFC circuit has the switching transistor Q1 and a driving circuit INV0 which takes as input the control signal /PWM and supplies the inverted signal thereof to the gate of the transistor Q1 as a driving pulse. As shown in the figure, this driving circuit has an inverter INV0; the inverter INV0 is provided between the high-potential power supply VDD and the source node N1 of the transistor Q1. That is, the switching circuit device CP of this embodiment has a switching transistor Q1 comprising an N-type enhancement HEMT formed on a compound semiconductor chip CP of GaN or similar, and an inverter INV0 which is a driving circuit to generate driving pulses for the switching transistor Q1.

This inverter INV0 has a pull-up transistor between the high-potential power supply VDD (for example 12 V) and the output node N2, and further has a pull-down transistor between the output node N2 and the source node N1 of the transistor Q1. When the control signal /PWM is at L level, the driving pulse of the output node N2 of inverter INV0 goes to H level, and the transistor Q1 is conducting. On the other hand, when the control signal /PWM changes from L level to H level, the driving pulse of the output N2 of the inverter INV0 changes from H level to L level, and the transistor Q1 becomes non-conducting. At this time, the pull-down transistor of the inverter INV0 enters the on state, and the gate and source (N2 and N1) of the transistor Q1 are short-circuited.

Hence as shown in the operation waveform diagram of FIG. 2, when the transistor Q1 is controlled to be turned off, even if the source node N1 of the transistor Q1 falls to negative potential due to the parasitic inductance Lp1, the gate node N2 of the transistor Q1 which is short-circuited to this source node N1 similarly falls to a negative potential. As a result, the gate-source voltage of the transistor Q1 is maintained at 0 V, below the threshold voltage, and there is no erroneous operation causing the transistor Q1 to be changed from off to on.

Further, considering the inverter operation, if the potential of the source node N1 falls due to noise or similar, the relation between the control signal /PWM and the source node N1 is such that the voltage difference between the control signal /PWM and the source node N1 is increased, and so the inverter operates so as to reliably short-circuit the gate node N2 and the source node N1.

(First Embodiment)

FIG. 3 depicts the PFC circuit and operation waveform of the AC/DC converter of a first embodiment. In FIG. 3, the inverter INV0 of FIG. 2 has driving transistors Q2 and Q3, provided between the high-potential power supply VDD and the source node N1 of the transistor Q1. These transistors Q2 and Q3, similarly to the transistor Q1, are N-type enhancement HEMTs formed on the GaN semiconductor chip CP. The control signal /PWM is applied to the gate of the pull-down transistor Q3 of the inverter INV0, and the control signal //PWM obtained by inverting the control signal /PWM is applied to the gate of the pull-up transistor Q2.

Hence the transistors Q1, Q2 and Q3 are formed on the GaN semiconductor chip CP, and external terminals are the five terminals SW, N1, VDD, /PWM and //PWM. The semiconductor chip CP is accommodated within a package PKG, and the five external terminals of the semiconductor chip CP are coupled to corresponding external terminals of the package PKG. In FIG. 3, a parasitic inductance Lp1 is only shown between the source node N1 of the transistor Q1 and the low-potential power supply (ground) VSS. This semiconductor chip CP, and the package PKG accommodating the chip, constitute the switching circuit device of this embodiment.

As shown in the operation waveform diagram, when the control signal //PWM changes from H level to L level and the control signal /PWM changes from L level to H level, the transistor Q2 is turned off and the transistor Q3 is turned on, the output N2 of the inverter INV0 (the gate of the transistor Q1) goes to L level, and the transistor Q1 is switched from on to off. As explained above, due to the change from conducting to non-conducting, the source node N1 of the transistor Q1 drops to negative potential because of the parasitic inductance Lp1. At this time, the pull-down transistor Q3 of the inverter INV0 is conducting, and so the gate N2 of the transistor Q1 similarly drops to negative potential, and so the gate-source voltage of the transistor Q1 does not exceed the threshold voltage, and erroneous operation in which the transistor Q1 is again turned on is avoided.

Because the transistor Q1 is turned off, the node SW rises to a high potential (for example 380 V), and current is supplied to the output terminal OUT via the diode D1.

Figure 4:
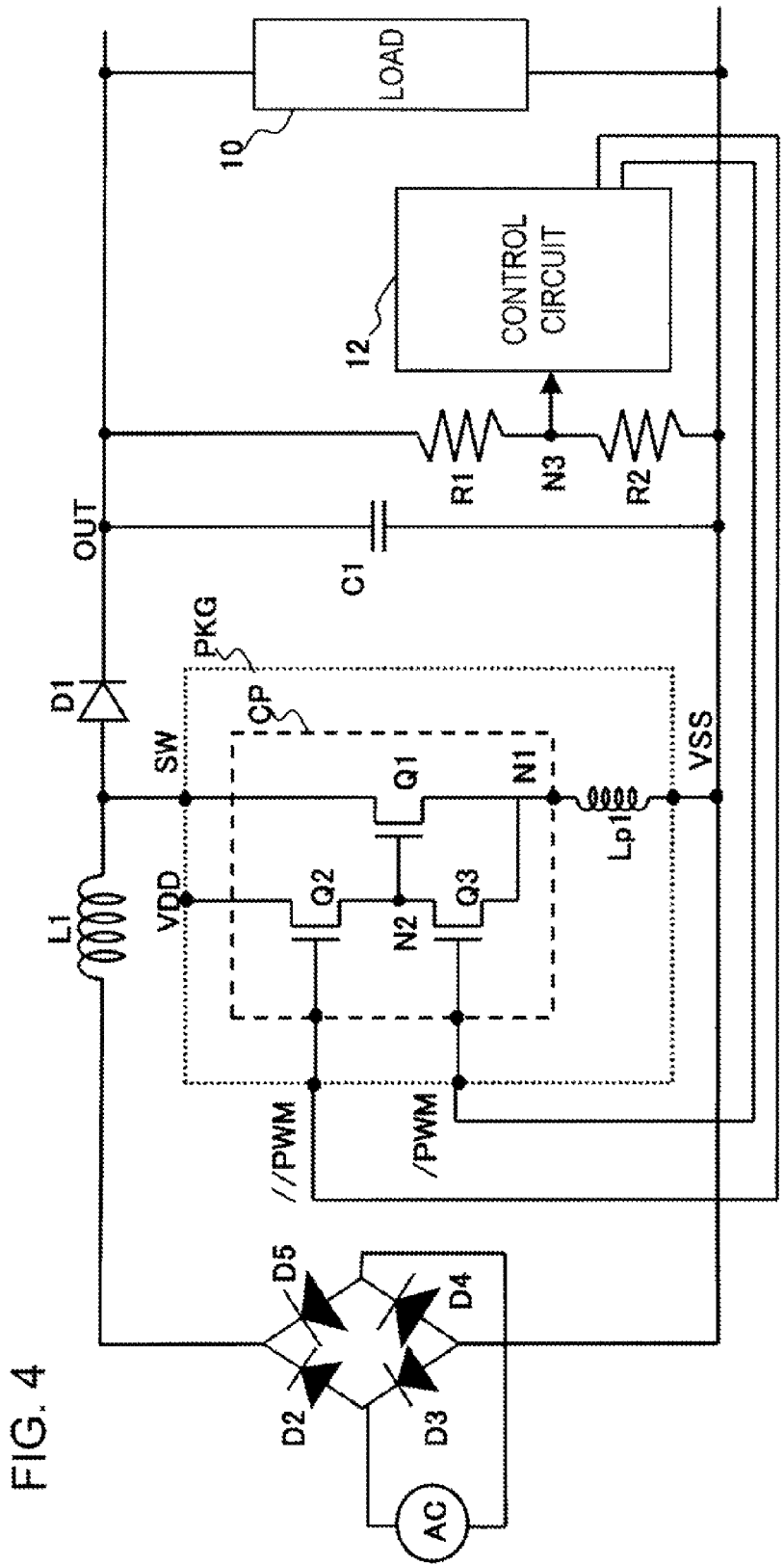
FIG. 4 depicts the system configuration of the AC/DC converter using the switching circuit device in the first embodiment.

FIG. 4 depicts the system configuration of the AC/DC converter using the switching circuit device in the first embodiment. In addition to the circuit of FIG. 3, a capacitor C1, series resistors R1 and R2, a control circuit 12 which monitors the voltage at the node N3 connecting the series resistors R1 and R2 and which generates the control signals /PWM and //PWM such that the voltage at the output terminal OUT is the desired voltage, and a load circuit 10 to which the DC output voltage generated at the output terminal OUT is supplied as a power supply, are shown between the output terminal OUT and ground VSS. Further, FIG. 4 depicts a diode bridge D2 to D5 which rectifies the AC power supply AC; the voltage obtained by rectifying the AC power supply AC is applied to one end of the coil L1.

As the high-potential power supply VDD of the semiconductor chip CP and package PKG comprised by the switching circuit device, for example a voltage which is stepped down by a step-down circuit, not shown, from the voltage of the output terminal OUT is used.

Figure 5:
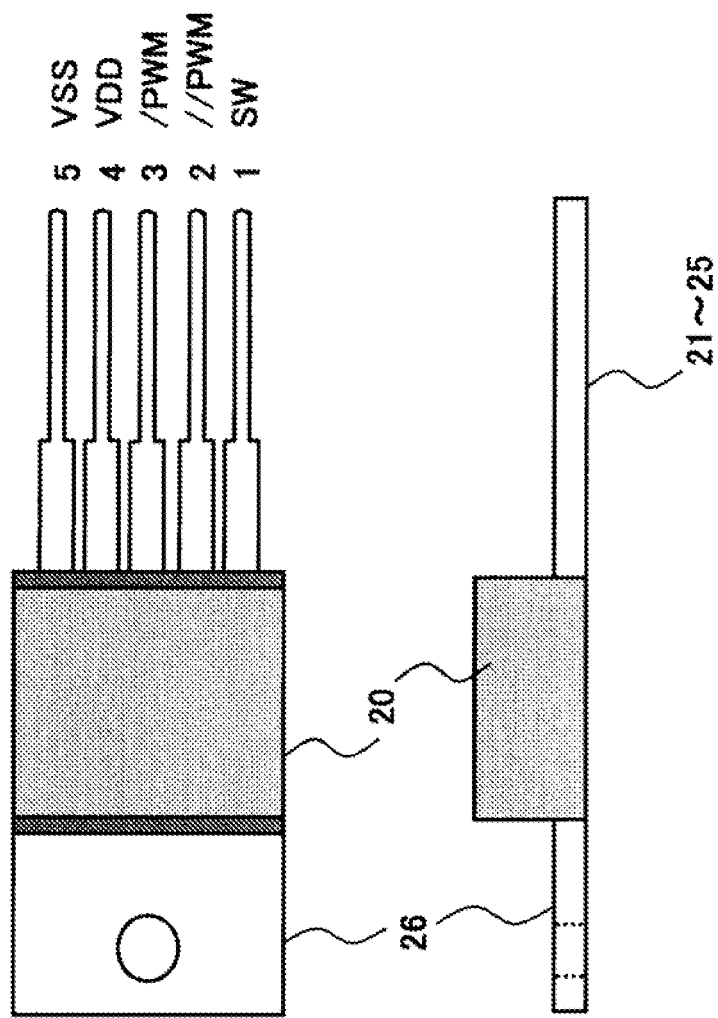
FIG. 5 depicts the package of the switching circuit device in the first embodiment.

FIG. 5 depicts the package of the switching circuit device in the first embodiment. In FIG. 5, a plane view and a side view are shown. The semiconductor chip is accommodated within the molded-resin body 20, and five external terminals 21 to 25 and a heat-dissipating metal member 26 are drawn out from the body 20. The signals of the external terminals 21 to 25 are as shown in the figure. These external terminals 21 to 25 are coupled, by bonding wires or similar, to the external terminals of the semiconductor chip within the body.

(Second Embodiment)

Figure 6:
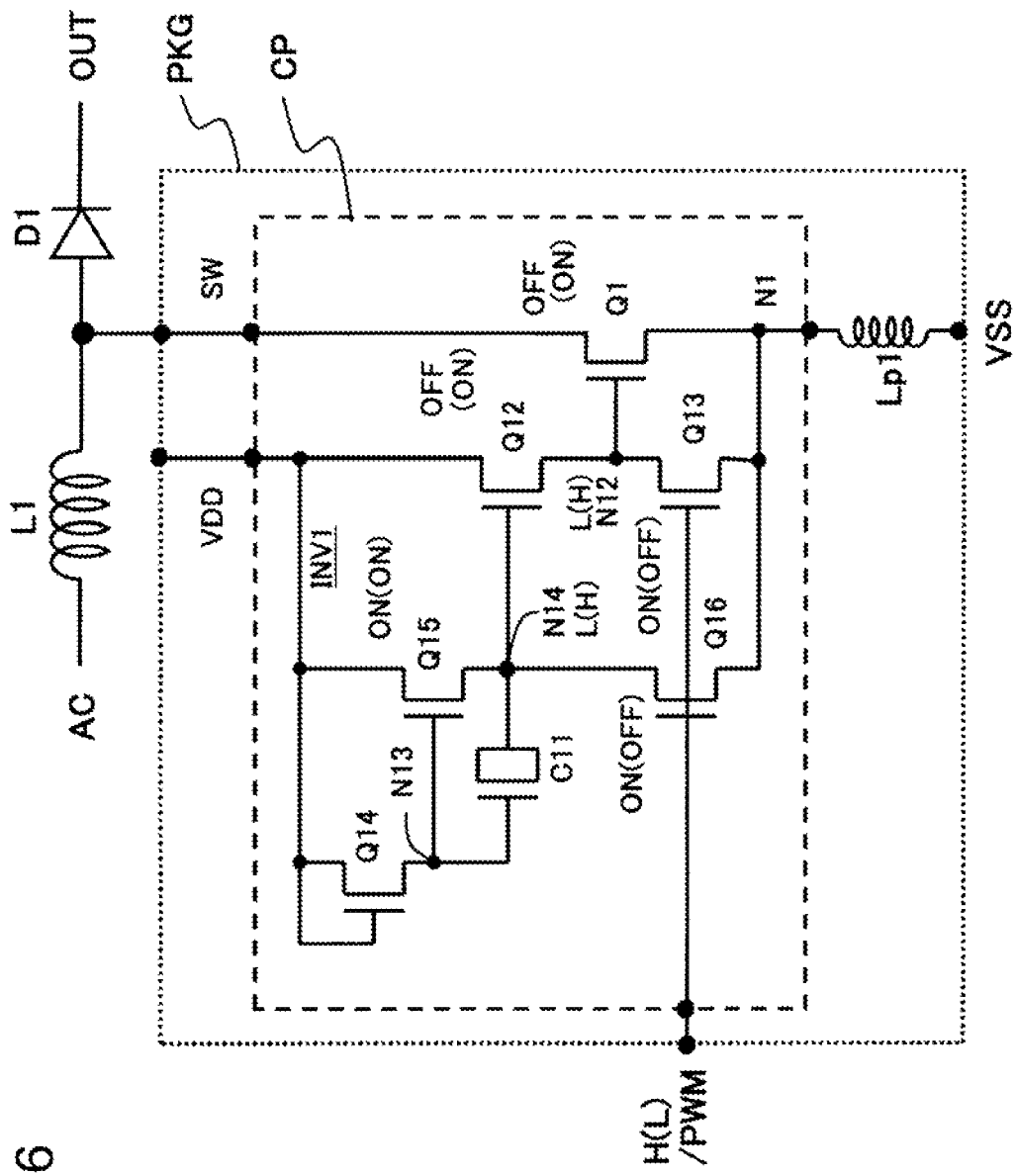
FIG. 6 depicts the switching circuit device in a second embodiment and an AC/DC converter circuit using this device.

FIG. 6 depicts the switching circuit device in a second embodiment and an AC/DC converter circuit using this device. In this switching circuit device, the driving circuit which supplies a driving pulse to the switching transistor Q1 has, in addition to the transistors Q12 and Q13 (corresponding to Q2 and Q3 in FIG. 3) which constitute an inverter and output driving pulses to the connection node N12, a control signal inversion circuit, including transistors Q14, Q15 and Q16 and a capacitor C11, which inverts the control signal /PWM and generates an inverted control signal at the node N14. These transistors Q14, Q15 and Q16, similarly to the transistors Q1, Q12 and Q13, are GaN N-type HEMTs, and are formed on the same GaN semiconductor chip CP.

Figure 7:
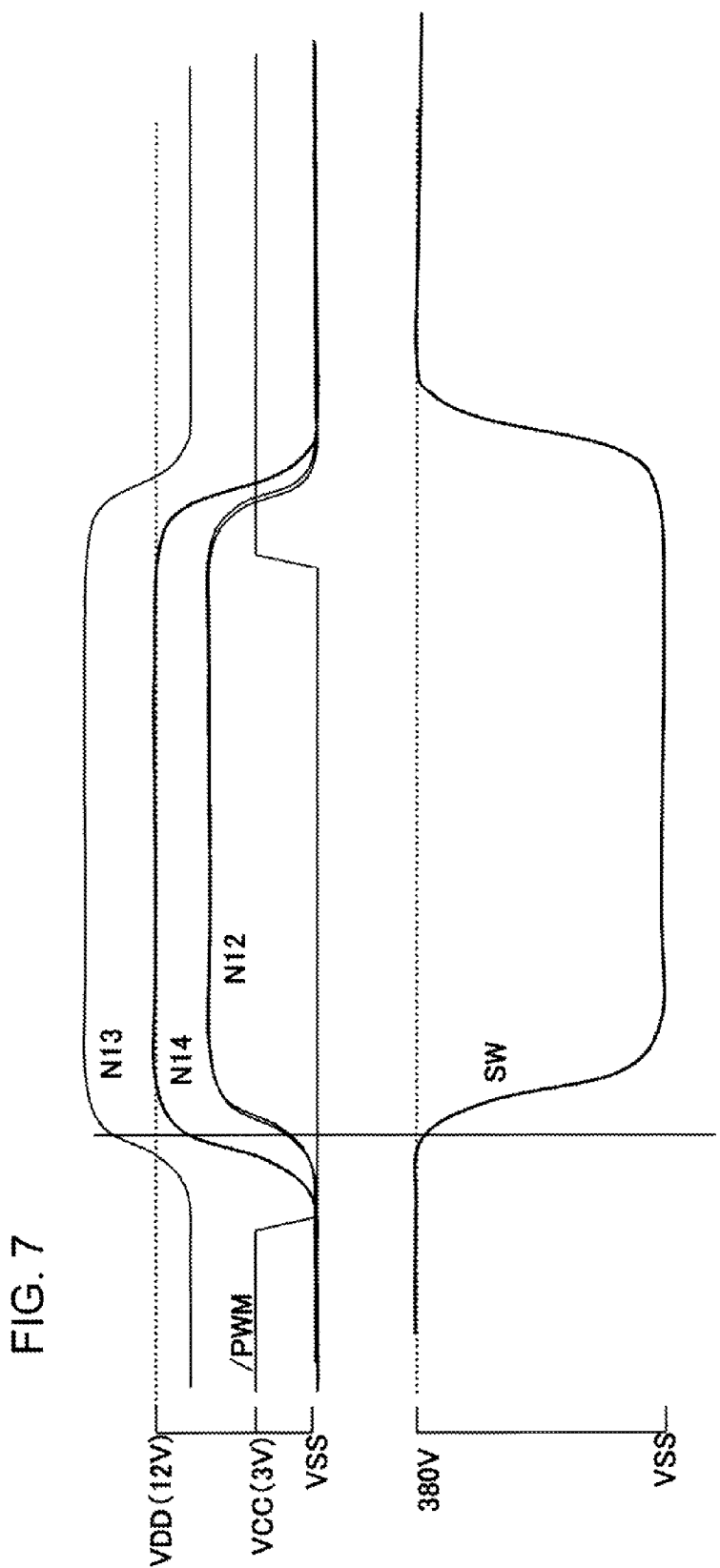
FIG. 7 is an operation waveform diagram for the switching circuit in the second embodiment.

FIG. 7 is an operation waveform diagram for the switching circuit in the second embodiment. Blow, operation is explained referring to the H and L levels at each node shown in FIG. 6 and transistor on and off states.

First, when the control signal /PWM is at H level (in this example, 3 V), transistors Q16 and Q13 are both on (in the conducting state), node N14 is at L level (ground VSS), node N12 is also at L level, and the switching transistor Q1 is off. At this time the current from the high-potential terminal SW to the low-potential power supply VSS is shut off, the terminal SW is at high potential (in this example, 380 V), and current flows toward the output terminal OUT. Due to the transistor Q14, the gate N13 of the transistor Q15 is at the potential VDD-Vth (where Vth is the threshold voltage of the transistor Q14), and node N14 is at L level, so that the transistor Q15 is in the on state.

Next, when the control signal /PWM goes to L level, the transistors Q16 and Q13 are both turned off, and due to the transistor Q15 which is in the on state the potential at the node N14 rises, node N13 rises to a higher potential than the high-potential power supply VDD due to coupling of the capacitor C11, and node N14 rises to the high-potential power supply VDD level due to the transistor Q15. As a result, the transistor Q12 changes from off to on, node N12 goes to H level (VDD-Vth), and the switching transistor Q1 is turned on. By this means, current flows from the node SW to ground VSS, and the potential at node SW falls to ground VSS.

When the control signal /PWM again changes from L level to H level, as when /PWM=H level described above, the switching transistor Q1 enters the off state. In this way, by providing the transistors Q14, Q15, Q16 and capacitor C11, a signal obtained by inverting the control signal /PWM is generated at the node N14, and the pull-up side transistor Q12 is driven to the on and off states. By this means, the switching circuit device need only have as external terminals one more terminal for the control signal /PWM in addition to SW, VDD and VSS, for a total of four external terminals. In this case, the package does not require an external terminal 22 for the signal //PWM among the five external terminals of the package shown in FIG. 5. Also, the control circuit 12 of FIG. 4 need only generate one control signal /PWM for supply to the switching circuit device.

(Third Embodiment)

Figure 8:
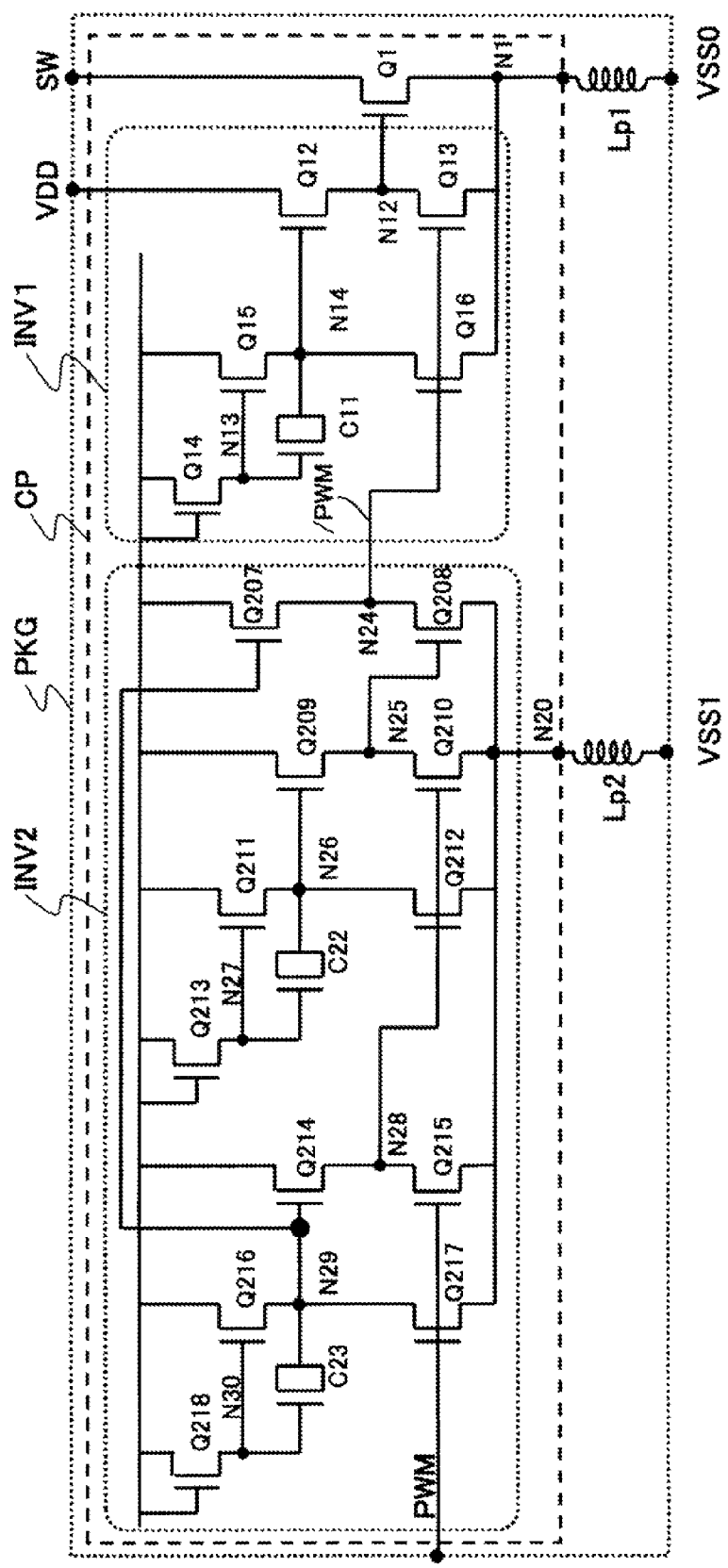
FIG. 8 depicts the switching circuit device of a third embodiment.

FIG. 8 depicts the switching circuit device of a third embodiment. The circuit on the semiconductor chip CP of this switching circuit device has, in addition to the switching transistor Q1 and the first inverter INV1 having transistors Q12 to Q16 and capacitor C11, shown in FIG. 6, a second inverter INV2. The second inverter INV2 inverts the normal phase control signal PWM to generate a reverse phase control signal /PWM.

Hence the switching circuit device of the third embodiment takes as input a normal phase control signal PWM, and the second inverter INV2 inverts this to generate a reverse phase control signal /PWM and inputs this to the first inverter INV1. By this means, the normal phase control signal PWM generated by the control circuit 12 of the AC/DC converter shown in FIG. 4 is supplied without modification to the switching circuit device.

The second inverter INV2 has a push-pull type inverter with transistor Q207 and Q208, a third inverter (Q209 to Q213 and C22) which supplies the driving signal N25 to the gate of the pull-down transistor Q208, and a fourth inverter (Q214 to Q218 and C23) which supplies the driving signal N29 to the gate of the pull-up transistor Q207. The third and fourth inverters have the same circuit configuration as the first inverter INV1, and operation is the same. The transistors Q209 to Q218 are also, for example, GaN N-type enhancement HEMTs. In this way, the second inverter INV2 inverts the normal phase control signal PWM and generates a reverse phase control signal /PWM, which is input to the first inverter INV1.

The fourth inverter inverts the control signal PWM and generates driving signals N29 and N28, and the third inverter inverts the signal N28 and generates the driving signal N25. Hence the signal at the output node N24 of the second inverter INV2 is a reverse phase control signal /PWM obtained by inverting the control signal PWM.

In this switching circuit device, the source node N1 of the switching transistor Q1 and low-potential node N1 of the first inverter INV1, and the low-potential node N20 of the second inverter INV2, are respectively coupled to the low-potential power supply terminals VSS0 and VSS1 via different bonding wires. By means of this configuration, when the switching transistor Q1 is turned off the drop to negative potential of the node N1 does not affect the low-potential node N20 of the second inverter INV2.

That is, when the switching transistor Q1 is turned off, the node N1 temporarily drops to negative potential, but the transistor Q13 is in the on state, and so the node N12 also follows this to drop to a negative potential, and the gate-source voltage of the transistor Q1 does not exceed the threshold voltage, so that erroneous operation in which the transistor Q1 is turned on is avoided. At this time, the node N24 (/PWM) is at H level, so that the drop to low potential of the node N1 does not in any way affect the on states of the transistors Q13 and Q16. That is, the node N1 and node N24 (/PWM) are in reverse phase, and do not affect the on states of the transistors Q13 and Q16.

On the other hand, at this time the node N28 is at L level and the transistors Q212 and Q210 are in the off state. Hence if the node N20 falls to negative potential similarly to the node N1, there is the possibility of erroneous operation in which the transistors Q212 and Q210 change from the off state to the on state. Hence the low-potential node N20 coupled to the low-potential power supply of the second inverter INV2 is coupled to the low-potential power supply terminal VSS1 of the package via a bonding wire (parasitic capacitance Lp2) different from that of the node N1, so that the drop to negative potential of node N1 has no effect on the node N20.

(Fourth Embodiment)

Figure 9:
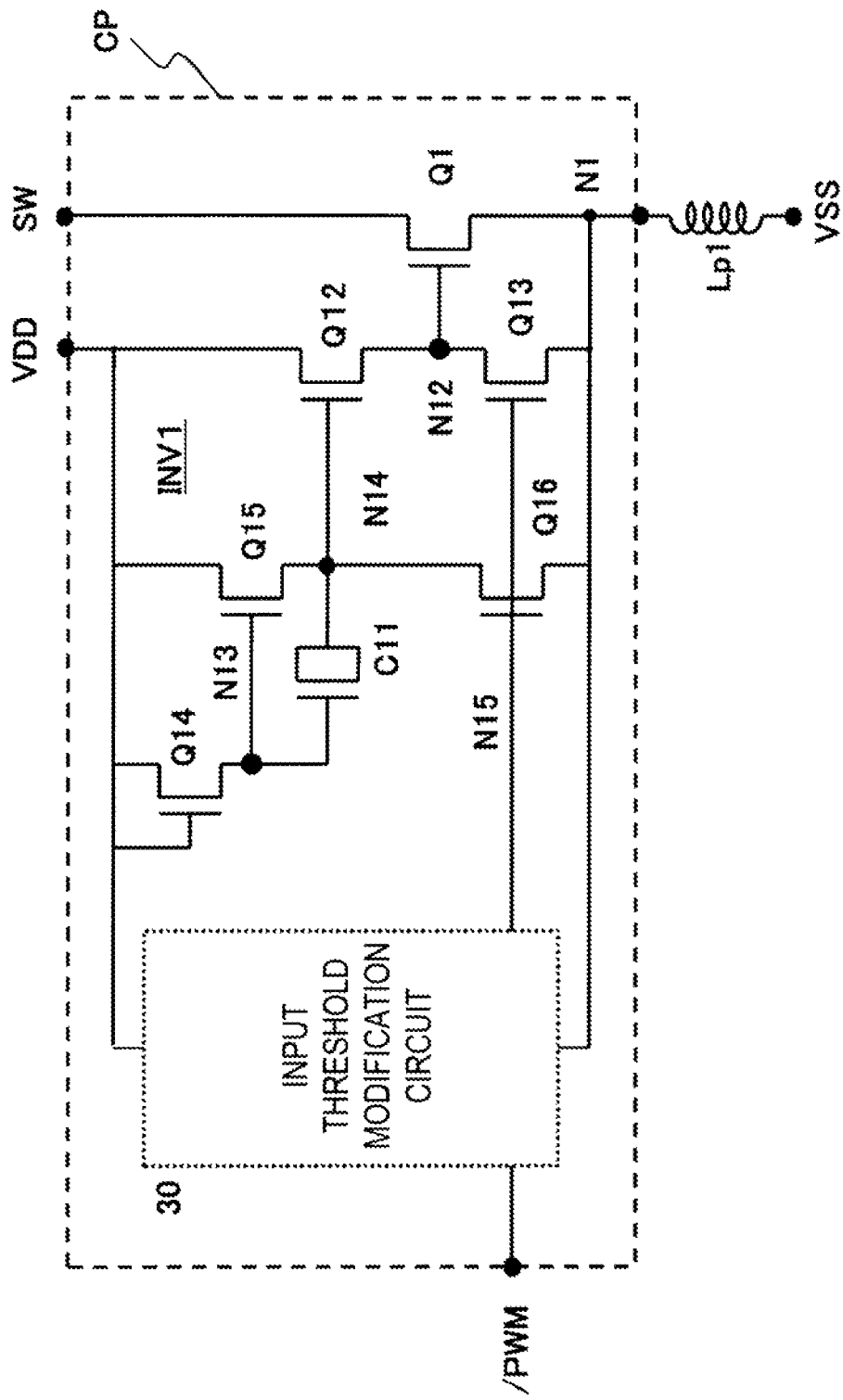
FIG. 9 is a circuit diagram of the switching circuit device in a fourth embodiment.

FIG. 9 is a circuit diagram of the switching circuit device in a fourth embodiment. As explained above, GaN N-type enhancement HEMTs have a low threshold voltage. Hence when the control signal /PWM from outside is at L level, if noise causes the potential to rise, transistors within the switching circuit device may undergo erroneous operation and be turned on. Hence in the switching circuit device of the fourth embodiment, an input threshold modification circuit 30 is provided between the control signal /PWM input from outside and the gate N15 of the transistors Q16 and Q13.

This input threshold modification circuit 30, in response to a change in the input control signal /PWM, generates a signal with the same phase at the node N15. However, the threshold voltage for the control signal /PWM in the input threshold modification circuit 30 is higher than the threshold voltages of the transistors Q16 and Q13. Hence noise immunity of the control signal /PWM input from outside the chip CP is enhanced.

Figure 10:
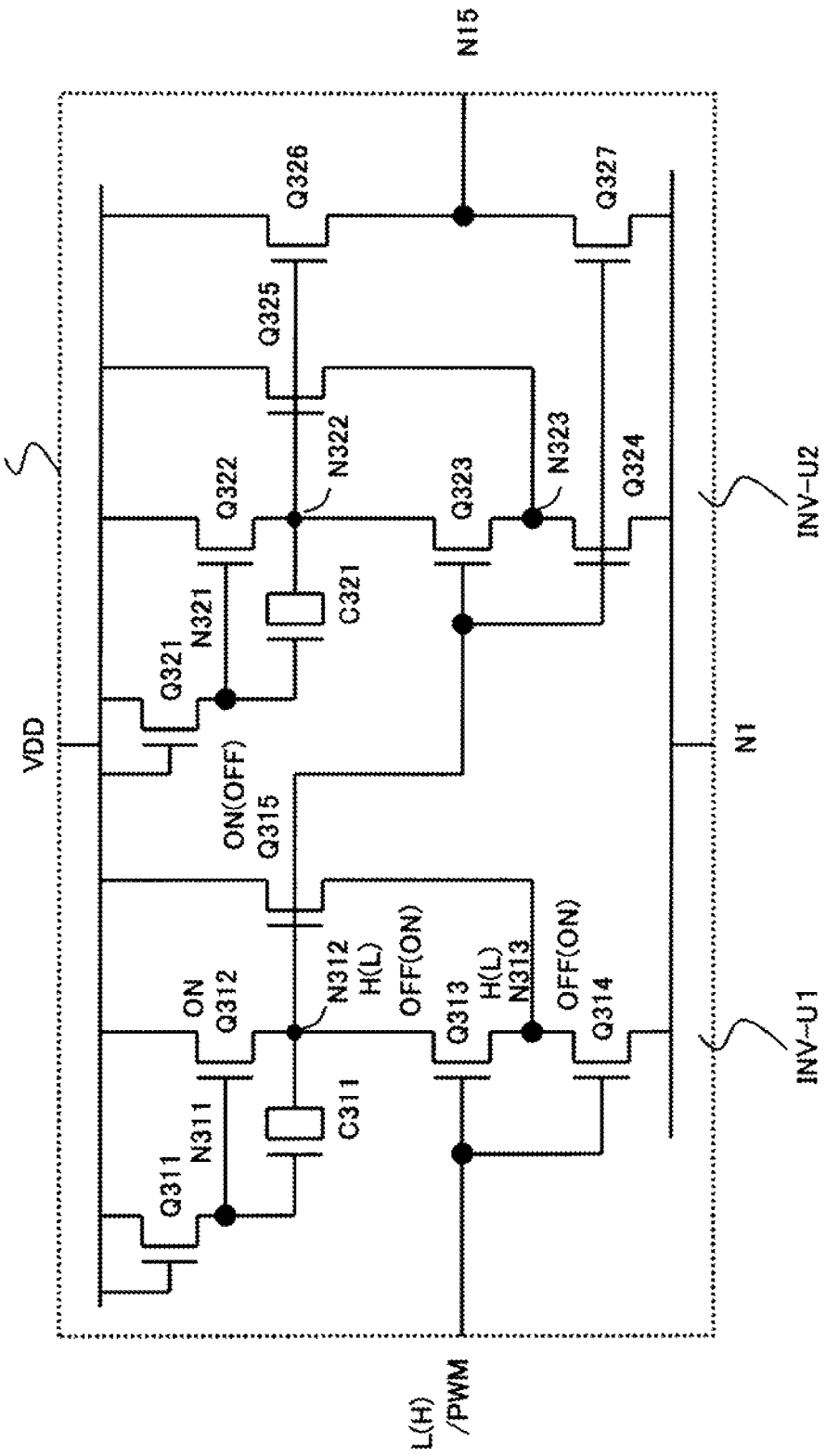
FIG. 10 is a circuit diagram of the input threshold modification circuit 30.

FIG. 10 is a circuit diagram of the input threshold modification circuit 30. This input threshold modification circuit 30 has a first inverter unit INV-U1 which adds transistors Q314 and Q315 to an inverter circuit having transistors Q311 to Q313 and a capacitor C311 configured similarly to the first inverter INV1, and a second inverter unit INV-U2 configured similarly to the first inverter unit and which takes as input the output N312 of the first inverter unit. Further, the input threshold modification circuit 30 has transistors Q326 and Q327 constituting a push-pull type inverter to the gate of which are supplied the outputs N312 and N322 of the first and second inverter units INV-U1 and INV-U2.

The first inverter unit INV-U1 takes as input the control signal /PWM and generates the inverted signal thereof N312, and the second inverter unit INV-U2 takes as input the inverted signal N312 and generates the inverted signal thereof N322. The two inverter unit outputs N312 and N322 are input to the gates of the push-pull type inverter transistors Q327 and Q326, and as shown in FIG. 9, the output N15 is input to the first inverter INV1.

Figure 11:
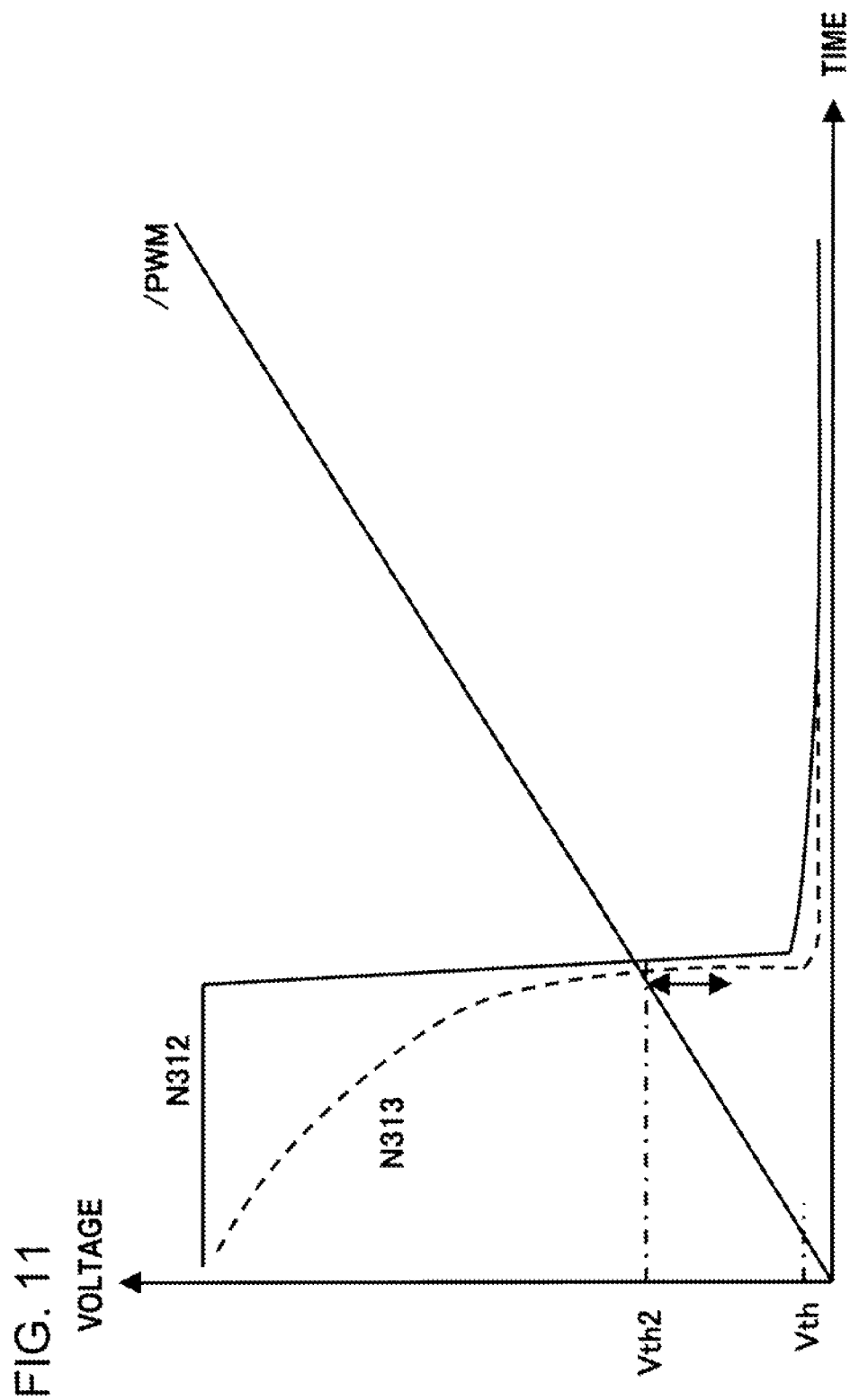
FIG. 11 is an operation waveform diagram of the input threshold modification circuit 30.

FIG. 11 is an operation waveform diagram of the input threshold modification circuit 30. In the first inverter unit INV-U1, when the control signal /PWM is at L level, the transistors Q313 and Q314 are off and the transistor Q312 is on, and when the node N312 is at H level the transistor Q315 is on and the node N313 is at H level.

When the control signal /PWM changes from L level to H level, if the control signal /PWM exceeds the threshold voltage of the transistor Q314, the transistor Q314 is turned on. As a result, the transistors Q315 and Q314 both enter the on state, and the node N313 is at an intermediate voltage between the high-potential power supply VDD and ground VSS. Consequently when the control signal /PWM exceeds the intermediate potential of the node N313 plus the threshold voltage, the transistor Q313 is first turned on, and the node N312 goes to L level. That is, when the control signal /PWM changes from L level to H level, the first inverter unit INV-U1 inverts its output N312 from H level to L level at a higher voltage Vth2 than the normal threshold voltage Vth of a transistor.

The second inverter unit INV-U2 takes as input the output signal of the node N312, and similarly to the first inverter unit INV-U1, when the node N312 changes from L level to H level performs inversion at a higher threshold voltage Vth2 than the threshold voltage Vth of a transistor.

In this way, the input threshold modification circuit 30 has a threshold higher than the normal threshold voltage of a transistor, for the control signal /PWM input from outside, and thus suppresses erroneous operation caused by noise.

Figure 12:
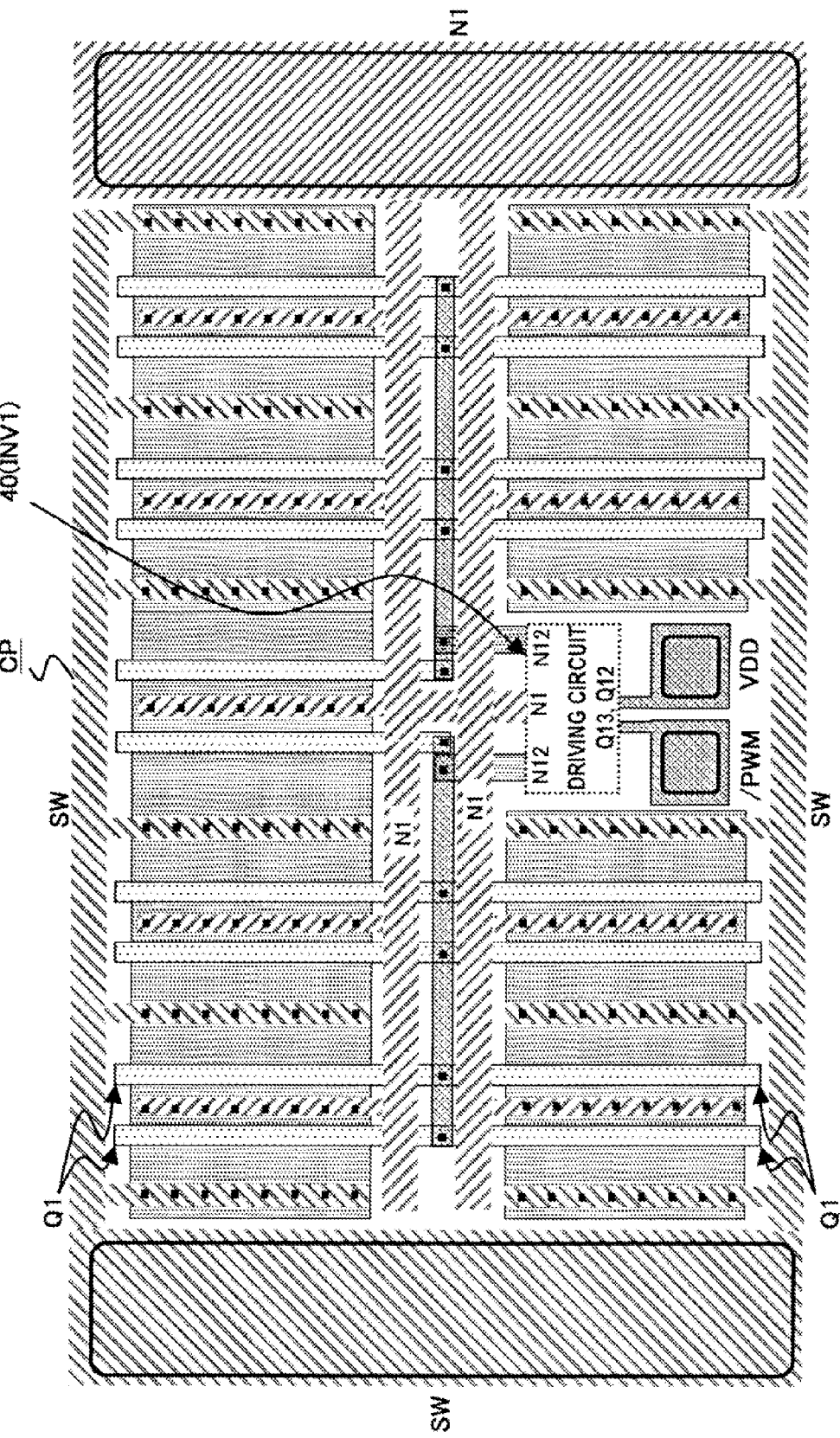
FIG. 12 is a chip plane view of the switching circuit devices in the first to third embodiments.

FIG. 12 is a chip plane view of the switching circuit devices in the first to third embodiments. In the figure, the pads of the external terminals SW, N1, /PWM and VDD on the chip, and conductive patterns coupled thereto are shown. Ten gates of the switching transistor Q1 are provided above and ten below, and on both sides of each gate are provided conductor patterns comprising external terminals SW, N1. In the driving circuit 40 is included a first inverter INV1 comprising at least transistors Q12 and Q13, and the driving circuit 40 is coupled to the external terminals /PWM and VDD. The driving circuit 40 is coupled to a conductor pattern from the external terminal N1, serving as a low-potential power supply. The driving circuit 40 is any one of the above-described first to fourth driving circuits.

The driving circuit 40, having at least a first inverter INV1, is disposed in the center position of the chip CP, and is arranged such that the potential of the source node N1 of the switching transistor Q1 comprising 20 gates is at substantially the same potential. That is, measures are taken such that the potential of the source node N1 of the switching transistor Q1 and the potential of the node N1 of the driving circuit are substantially equal.

(Fifth Embodiment)

Figure 13:
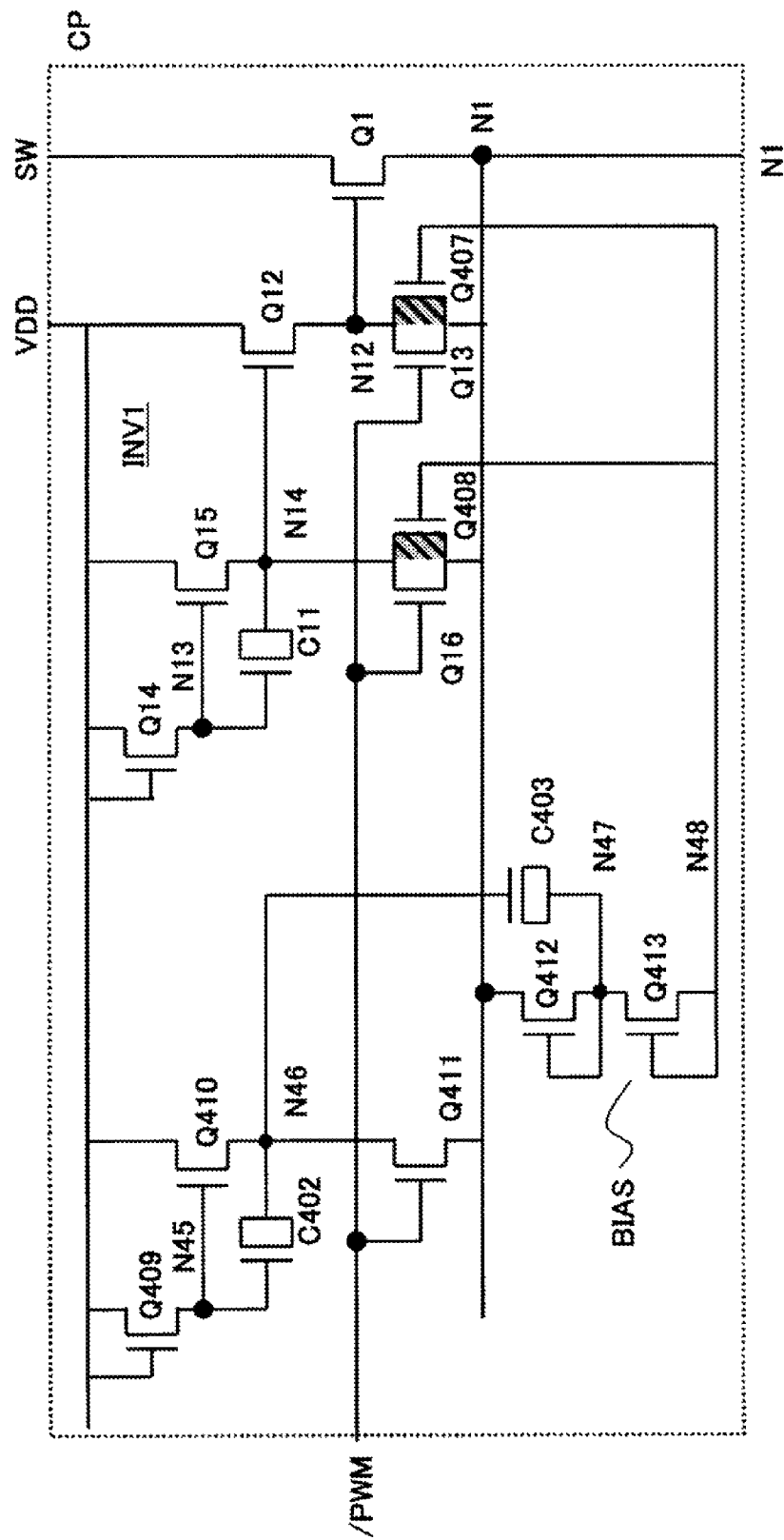
FIG. 13 depicts the switching circuit device in a fifth embodiment.

FIG. 13 depicts the switching circuit device in a fifth embodiment. Because of the low threshold voltage of the switching transistor Q1, comprising a GaN N-type enhancement HEMT, when the power supply AC is applied and the switching transistor Q1 conducts due to noise and similar, a large current flows from the node SW toward ground VSS. In order to prevent this, N-type depression HEMT transistors Q408 and Q407 are provided in parallel with the transistors Q16 and Q13 of the first inverter INV1 which generates the driving pulse for the transistor Q1 at the node N12.

Further, at the time power is applied the gates of these transistors Q408 and Q407 are at ground potential, but after power is applied the node N48 which drops to negative potential is coupled. That is, an inverter circuit which takes the control signal /PWM as input and comprises transistors Q409, Q410, Q411 and the capacitor C402, and a bias circuit BIAS which performs pumping operation by means of the pulse signal of the output node N46 of this inverter circuit to drive the node N48 to negative potential, comprising transistors Q412 and Q413 and the capacitor C403, are provided.

When the input power supply AC begins to be supplied to the AC/DC converter, a high voltage is applied to the node SW. At this time, even when a voltage reaching that of the high-potential power supply VDD is not generated, the node N48 at the same potential as ground VSS is at ground potential, so that the depression transistors Q408 and Q407 both enter the on state. Hence the gate and source of the switching transistor Q1 are short-circuited by the conducting state of the transistor Q407, and the node N14 goes to ground potential due to the conducting state of the transistor Q408 and the transistor Q12 is in the off state, so that the gate node N12 of the transistor Q1 remains at ground potential, and the off state of the transistor Q1 is maintained. By this means, erroneous conduction of the transistor Q1 at the time power is applied is avoided.

After application of power, a pulse signal is supplied to the control signal terminal /PWM, and the inverted pulse signal thereof is generated at the node N46. Then, the bias circuit BIAS performs pumping operation via the capacitor C403, charge is drawn out from the node N48 via the transistors Q413 and Q412 to ground VSS, and the node N48 is driven to a negative potential. As a result, the depression type transistors Q408 and Q407, which are provided to prevent erroneous operation, are both in the off state, and the first inverter INV1 begins usual operation. In place of the control signal /PWM, the pulse signal may be generated after the power supply has been started and the entire circuit has stabilized.

In this way, in the switching circuit device of the fifth embodiment, by providing depression type transistors Q407 and Q408, erroneous conduction of the transistor Q1 when the power supply AC is applied to the AC/DC converter is prevented.

As explained above, by means of a switching circuit device of these embodiments, when a large current is shut off as the switching transistor Q1 changes from on to off, erroneous operation in which the transistor Q1 is again switched to the on state due to parasitic inductance or similar is prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

What is claimed is:

1. A switching circuit device, comprising:
   a first transistor which has a drain coupled to a high-potential terminal, a source coupled to a low-potential power supply; and
   a driving circuit, which outputs, to a gate of the first transistor in response to an input control signal, a pulse having a potential higher than a threshold voltage of the first transistor and a potential of the low-potential power supply, wherein
   the driving circuit has a first inverter including a second transistor provided between the gate and the source of the first transistor,
   wherein when the first transistor changes from on to off due to the pulse, the second transistor conducts and short-circuits the gate and the source of the first transistor.

2. The switching circuit device according to claim 1, comprising
   a semiconductor chip in which the first transistor and the driving circuit are formed; and
   a package which accommodates the semiconductor chip, wherein
   the package has a low-potential power supply terminal coupled via bonding wire to a source terminal, to which the source of the first transistor of the semiconductor chip is coupled.

3. The switching circuit device according to claim 1, wherein the high-potential terminal is coupled to a coil of a power supply converter, and when the first transistor is conducting the coil accumulates energy.

4. The switching circuit device according to claim 3, wherein an input power supply is coupled to a first terminal of the coil, a unidirectional element is coupled to a second terminal, and when the first transistor is non-conducting, the energy accumulated in the coil is output via the unidirectional element.

5. The switching circuit device according to claim 2, wherein the first inverter further comprises a third transistor provided between the gate of the first transistor and the high-potential power supply, and the pulse is generated at the node connecting the second transistor and third transistor.

6. The switching circuit device according to claim 5, wherein
   the first inverter comprises a control signal inversion circuit which receives a first control signal as input and inverts the first control signal,
   the first control signal is supplied to the gate of the second transistor, and
   the inverted control signal of the first control signal is supplied to the gate of the third transistor.

7. The switching circuit device according to claim 5, wherein
   the first inverter receives a first control signal as input,
   the first control signal is supplied to the gate of the second transistor, a first inverted control signal obtained by inverting the first control signal is supplied to the gate of the third transistor,
   the driving circuit further comprises a second inverter which is provided between the high-potential power supply and low-potential power supply and which inverts a second control signal and outputs the first control signal, and
   the low-potential terminal of the second inverter is coupled to the low-potential power supply terminal of the package via a bonding wire different from that of the source terminal of the second transistor of the first inverter.

8. The switching circuit device according to claim 5, wherein
   the second transistor has a first threshold voltage,
   and further comprising:
   a modification circuit which, in response to the input control signal, switches the potential of the first control signal based on whether the input control signal is higher than a second threshold voltage,
   the second threshold voltage being higher than the first threshold voltage.

9. The switching circuit device according to claim 8, wherein the modification circuit comprises a first inverter unit, having:
- a first input transistor, to the gate of which the input control signal is supplied, and the source of which is coupled to the low-potential power supply;
- a second input transistor, to the gate of which the input control signal is supplied, and which is cascode-coupled with the first input transistor;
- a third transistor, provided between the second transistor and the high-potential power supply; and
- a fourth transistor, the gate of which is coupled to the connection node of the second and third transistors, and which is provided between the first transistor and high-potential power supply.

10. The switching circuit device according to claim 9, wherein the modification circuit further comprises a second inverter unit to which is input the output signal generated at the connection node of the first inverter unit, and push-pull type fifth and sixth transistors, to the respective gates of which the output signals of the first and second inverter units are supplied, and which are provided between the high-potential power supply and low-potential power supply.

11. The switching circuit device according to claim 1, wherein the source of a transistor in a circuit that drives the second transistor and the source of the second transistor are commonly coupled, and a phase of the input control signal is the similar to that of the drain of the second transistor.

12. A switching circuit device, comprising:
- a first transistor which has a drain coupled to a high-potential terminal, a source coupled to a low-potential power supply, and a gate, and which switches a current between the high-potential terminal and low-potential power supply; and
- a driving circuit which receives as input an input control signal, and outputs to the gate of the first transistor a pulse having a potential higher than a threshold voltage of the first transistor and a potential of the low-potential power supply, wherein
- the driving circuit comprises a first inverter including a second transistor provided between the gate and source of the first transistor, and when the first transistor changes from on to off due to the pulse, the second transistor conducts and short-circuits the gate and source of the first transistor; and
- the driving circuit further comprises a depression transistor in parallel with the second transistor, the switching circuit device further comprising:
- a bias circuit which supplies to a gate of the depression transistor a first control voltage which causes the depression transistor to be conductive at the time of power application and supplies to the gate of the depression transistor a second control voltage which causes the depression transistor to be non-conductive after power application, a potential of the second control voltage being lower than a potential of the low potential power supply.

13. The switching circuit device according to claim 12, wherein the second transistor is an enhancement transistor.

14. A control circuit, comprising:
- a transistor which has a drain coupled to a first high-potential power supply terminal and a source coupled to a low-potential power supply terminal; and
- an inverter which, in response to an input signal, outputs to the gate of the transistor an output signal which is driven to a potential of a second high-potential power supply terminal or to a potential of the source.

* * * * *